United States Patent
Chan et al.

(10) Patent No.: US 8,028,390 B2
(45) Date of Patent: Oct. 4, 2011

(54) SPRING ACTUATED CLAMPING MECHANISM

(75) Inventors: Benson Chan, Vestal, NY (US);
Matthew J. Lauffer, Waverly, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 539 days.

(21) Appl. No.: 12/215,079

(22) Filed: Jun. 25, 2008

(65) Prior Publication Data

US 2009/0320280 A1    Dec. 31, 2009

(51) Int. Cl.
*B23P 19/04* (2006.01)
*B25B 1/20* (2006.01)

(52) U.S. Cl. ............... 29/238; 29/739; 29/747; 29/748; 29/884; 29/874; 269/37

(58) Field of Classification Search ............ 29/764, 29/739, 747, 884, 874, 741, 758, 238; 269/6, 269/216, 95, 37, 43; 324/754, 765; 361/704, 361/759, 803, 807, 810
See application file for complete search history.

(56) References Cited

U.S. PATENT DOCUMENTS

| | | | |
|---|---|---|---|
| 5,051,366 A * | 9/1991 | Anderson et al. | 436/67 |
| 5,296,652 A * | 3/1994 | Miller, Jr. | 174/265 |
| 5,473,610 A * | 12/1995 | Rainard | 370/395.62 |
| 6,386,890 B1 * | 5/2002 | Bhatt et al. | 439/67 |
| 6,477,058 B1 | 11/2002 | Luebs | |
| 6,549,418 B1 | 4/2003 | Deeney | |

* cited by examiner

*Primary Examiner* — Derris H Banks
*Assistant Examiner* — Tai Nguyen
(74) *Attorney, Agent, or Firm* — Mark Levy; Lawrence R. Fraley; Hinman, Howard & Kattell

(57) ABSTRACT

A spring actuated clamping mechanism has a backer plate with an upper surface and a lower surface. A set of apertures is formed along the periphery of the backer plate. The upper surface of the backer plate has at least one backer plate recess, and preferably four recesses, formed therein. A threaded aperture is also formed in the backer plate. A compression plate is also provided. A second set of apertures is formed along the periphery of the compression plate. The lower surface of the compression plate has at least one compression plate recess, and at least one compression plate aperture. At least one compression spring is disposed between the backer plate and the compression plate. A screw tension release mechanism is screwed into the backer plate threaded aperture and inserted through the compression plate aperture. When the release mechanism is loosened, backer plate is forced downwardly, applying a uniform force to all electrical contacts on the printed circuit board or card to which the clamping mechanism is attached.

7 Claims, 4 Drawing Sheets

SPRING ACTUATED CLAMPING MECHANISM

FIELD OF THE INVENTION

The present invention relates to clamping mechanisms for the application of force to electrical contacts in printed circuit boards (PCBs) and, more particularly, to a spring actuated clamping mechanism for applying uniform force to PCB electrical contacts.

BACKGROUND OF THE INVENTION

Pressure or force is a necessary evil in most electronic packages. In order for an electrical circuit to be made, mechanical connections between electric terminals or contacts is required. In general, of course, the higher the number of electrical connection to be made, the greater the force that is needed. In the case of delicate land grid array (LGA) printed circuit cards and boards having hundreds or thousands of electrical contacts, however, great contacting force can be counterproductive. That is, small and delicate pads, lands, and contacts must withstand appreciable forces applied thereto. The present state of the art packages produced by the Assignee of the present invention include 5,448 contacts, each of which requires 60 g. of force to ensure a proper reliable electrical connection.

Another problem with applying forces to electrical contacts, especially around the periphery of a LGA connector, is the unequal application and mismatch of such force, sometimes resulting in skewing of the components. This results in better connections along a certain portion of the bank of contacts than along another portion thereof.

Discussion of Related Art

U.S. Pat. No. 6,477,058 for INTEGRATED CIRCUIT PACKAGE DEVICE INCLUDING MULTIPLE STACKED COMPONENTS, issued Nov. 5, 2002 to Richard J. Luebs et al teaches an integrated circuit device package comprising a LGA interposer socket positioned between, and in communication with, an LGA integrated circuit device and a first side of a first circuit board; a second LGA interposer socket positioned between, and in communication with, a second circuit board and a second side of the first circuit board, wherein the second side of the first circuit board is opposite to and parallel with the first side of the first circuit board; and a clamping mechanism for compressively urging together the LGA integrated circuit device, the first LGA interposer socket, the first circuit board, the second LGA interposer socket, and the second circuit board into electrical interconnection under a predetermined load.

U.S. Pat. No. 6,549,418 for LAND GRID ARRAY INTEGRATED CIRCUIT DEVICE MODULE, issued Apr. 15, 2003 to Jeffrey L. Deeney teaches an integrated circuit device module comprising a printed circuit board having opposed sides, the printed circuit board comprising a portion carrying an area contact array on one of the sides of the printed circuit board. The module comprises an integrated circuit device having opposed, top and bottom surfaces, the bottom surface of the integrated circuit device comprising an area contact array for electrical communication with the area contact array on the printed circuit board. The module further comprises a clamping mechanism for compressively urging the area contact array on the bottom surface of the integrated circuit device into electrical communication with the area contact array on the portion of the printed circuit board. A biasing structure is coupled to the printed circuit board for counteracting the forces applied by the clamping mechanism and the resulting tendency of the portion of the printed circuit board to deflect.

It would be advantageous to provide apparatus for applying pressure or force to electrical contacts.

It would also be advantageous to apply pressure to electrical contacts in an LGA uniformly.

It would also be advantageous to apply pressure to all electrical contacts simultaneously.

It would further be advantageous to prevent damage to electrical contacts upon the application of pressure thereto.

It would still further be advantageous to apply pressure by means of a preloaded device.

SUMMARY OF THE INVENTION

In accordance with the present invention, there is provided a spring actuated clamping mechanism. A backer plate has a set of apertures formed along the periphery. The upper surface of the backer plate has at least one backer plate recess, and preferably four recesses, formed therein. A threaded aperture is also formed in the backer plate. A compression plate is provided with a second set of apertures formed along the periphery of the compression plate, each of the set of compression plate apertures corresponding to each of the set of backer plate apertures. The lower surface of the compression plate has at least one compression plate recess, and at least one compression plate aperture. At least one compression spring, and preferably four springs, is disposed between the backer plate and the compression plate. The compression spring(s) is retained by the respective backer plate and compression plate recesses. A screw tension release mechanism is screwed into the backer plate aperture and inserted through the compression plate aperture.

BRIEF DESCRIPTION OF THE DRAWINGS

A complete understanding of the present invention may be obtained by reference to the accompanying drawings, when considered in conjunction with the subsequent detailed description, in which.

For the sake of clarity and brevity, like elements and components of each embodiment will bear the same designations throughout the description.

DESCRIPTION OF THE PREFERRED EMBODIMENT

Generally speaking, the present invention features a spring actuated clamping mechanism that has a backer plate. A set of apertures is drilled or otherwise formed along the periphery of the backer plate. A compression plate having an aperture is also provided. At least one compression spring is disposed between the backer plate and the compression plate. A release mechanism is screwed into the backer plate aperture and inserted through the compression plate aperture.

Figure 1:
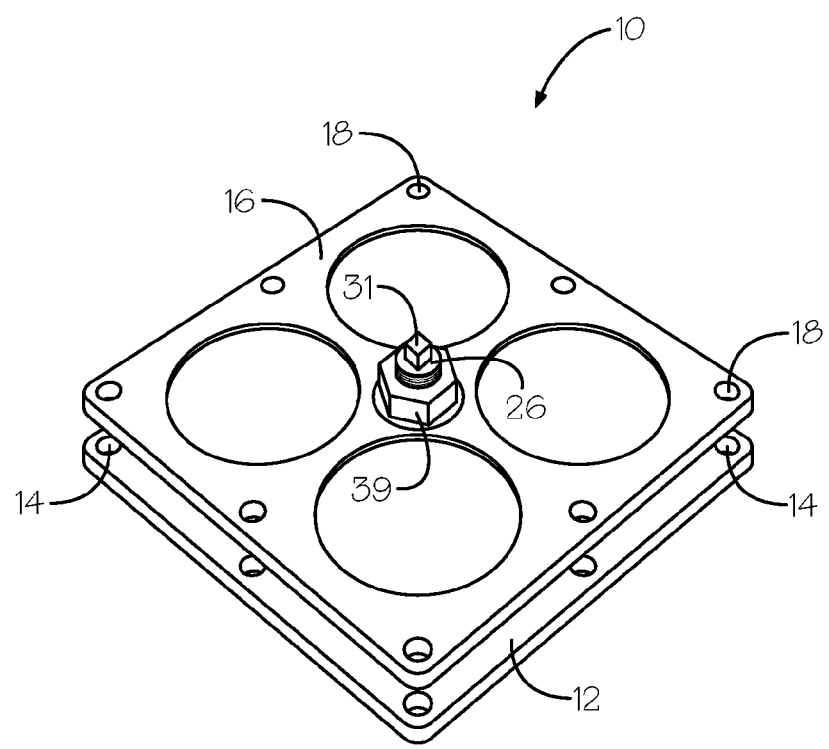
FIG. 1 is a perspective view of the clamping mechanism in accordance with the present invention.

Referring now to FIG. 1, there is shown a perspective view of the spring actuated clamping mechanism 10 in accordance with the invention. Clamping mechanism 10 has a substantially planar, rectangular backer plate 12. Backer plate 12 is steel and has eight spaced apart apertures 14 formed around the periphery thereof.

A steel compression plate 16, having similar or identical dimensions to backer plate 12, also has a plurality of spaced apart apertures 18 around the periphery thereof. A set of compression springs (not shown in this figure), described in greater detail hereinbelow, separates backer plate 12 from compression plate 16. Any number of compression springs can be used, depending upon the configuration of the respective plates 12, 16. Preferably, however, an even number of compression springs is incorporated in the clamping mechanism 10.

Figure 2:
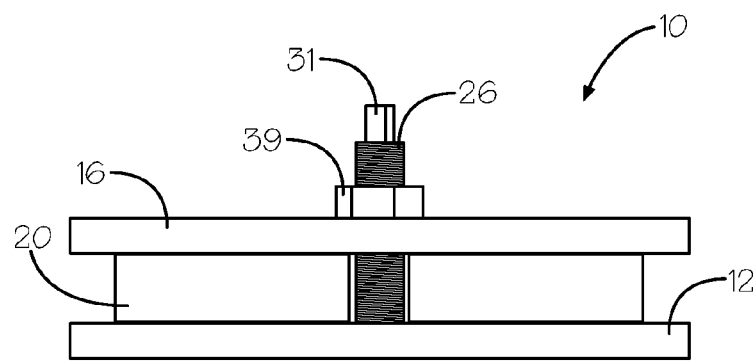
FIG. 2 is a side view of the clamping mechanism showing compression springs.
Figure 3A:
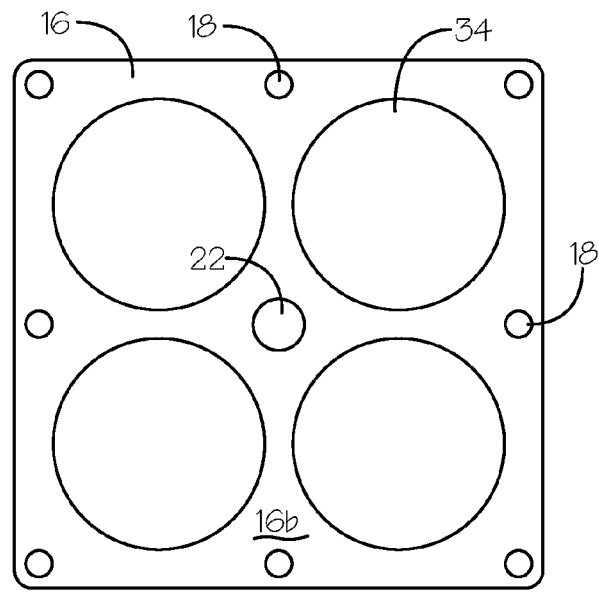
FIGS. 3a and 3b are plan views of the lower surface of compression plate and the upper surface of backer plate, respectively.
Figure 3B:
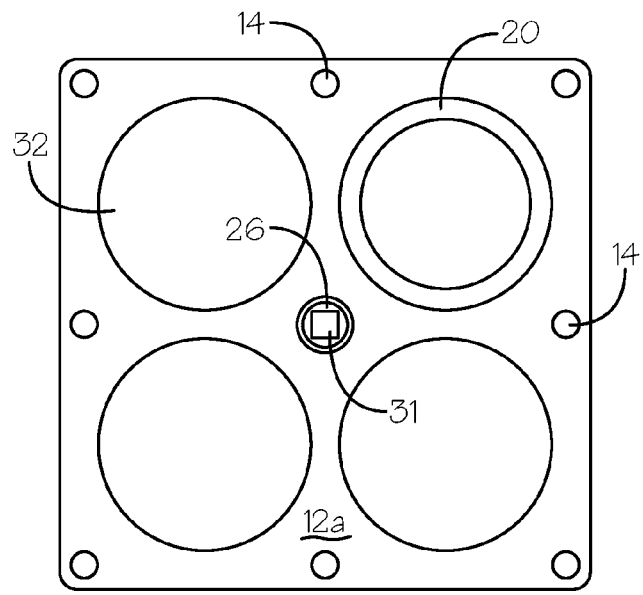

At or about the center of compression plate 16 is a central compression aperture 22 (FIG. 3a) that is aligned with a central backer aperture, not shown in this figure, in backer plate 12. Threaded through central apertures 22, 24 is a screw tension release rod 26, the upper portion of which is retained by a washer and nut 28, 39, respectively. Nut 30 can be tightened to clamp backing plate 12 and compression plate 16 and to tighten, and therefore displace, compression springs 20 (FIG. 2). A shoulder 31 is also provided on release rod 26 to limit the applied force so as not to over-compress compression springs 20.

Referring now to FIGS. 2, 3a, 3b and 3c there is shown a cutaway view of clamping mechanism 10. Each compression spring 20 is seated in a recess 32 on the upper surface 12a of backer plate 12 and in the corresponding recess 33 on the lower surface of compression plate 16b.

Figure 3C:
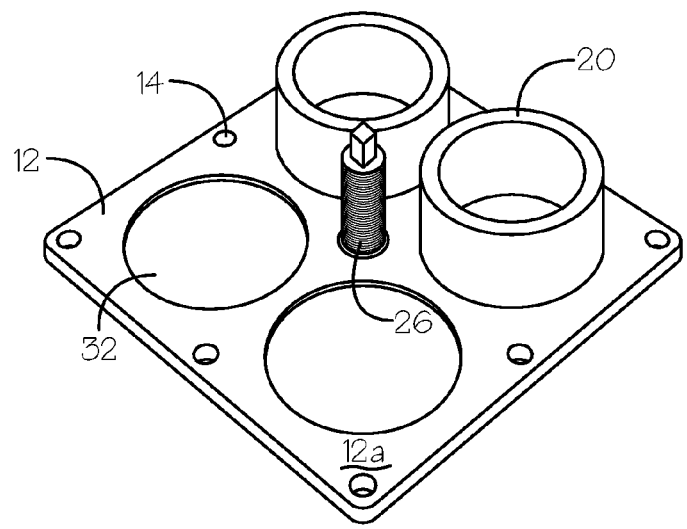
FIG. 3c is a plan view of the upper surface of backer plate with compression springs disposed thereon.
Figure 4:
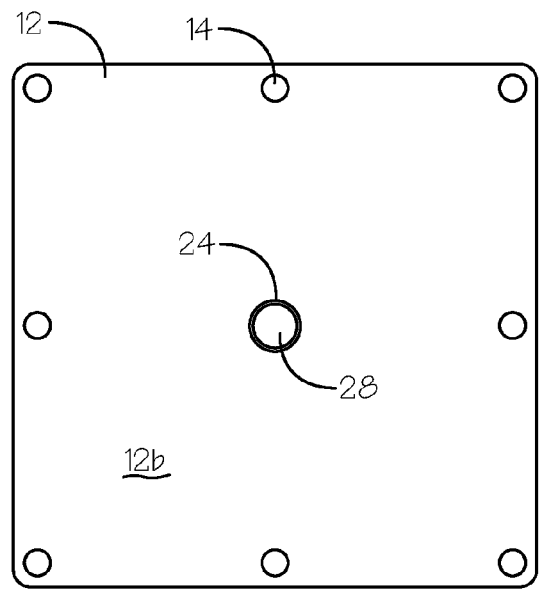
FIG. 4 is a plan view of the lower surface of backer plate.

Referring now to FIG. 4 there is shown the clamping mechanism 10 from the lower surface 12b of backer plate 12. Centrally located aperture 24 securely retains the lower plate 28 of rod 26 (FIG. 3c). In other words, rod 26 is permanently attached to backer plate 12 via aperture 24.

Figure 5:
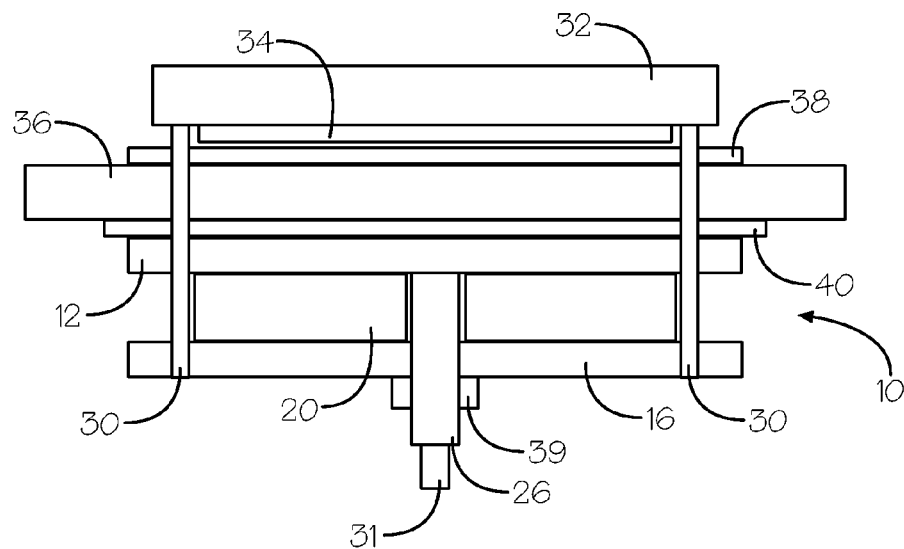
FIG. 5 is a side, in situ view of the spring actuated clamping mechanism of the present invention.

Referring now to FIG. 5 there is shown a cross-sectional view of the clamping mechanism 10 positioned via eight alignment posts 30 through back plate apertures 18 and compression plate aperture 16 to a heat spreader or heat sink 32 having an IC device or module 34 attached thereto. A PC board 36 having one or more connectors 38 mounted thereon is positioned relative to the IC device 34 on the lower surface of PC board 36 can be mounted an insulator 40.

In operation, each of the periphery apertures 14, 18 receives an alignment post 30 that is connected to heat sink 32 on printed circuit board or card 36, not shown, for which pressure is required. Clamping mechanism 10 is first pretensioned by tightening nut 39 and placing clamping mechanism 10 over the subject printed circuit board or card 36 by means of posts 30 connected to heat sink 32 on or proximate circuit board or card 36. An insulator plate, not shown, used to prevent any electrical short that can occur if the metal backer plate 12 contacts the pads on the printed circuit board or card 36. Once appropriately positioned, nuts and washers are used to hold clamping mechanism 10 against the board or card 36. The clamping mechanism 10 is used to apply pressure uniformly to all electrical contacts 34, 38 proximate the lower surface 12b of backer plate 12. Activation of the clamping mechanism 10 is accomplished by unscrewing nut 39 so that compression springs 20 are permitted to expand and force backer plate 12 against board 36 and IC module 34. At this point, nut 39 and corresponding washer can be removed from clamping mechanism 10.

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A spring actuated clamping mechanism, comprising:
   a) a backer plate having an upper surface and a lower surface and a first plurality of apertures along the periphery thereof, said upper surface having at least one backer plate recess formed therein, and at least one threaded, backer plate aperture formed therein;
   b) a compression plate having an upper surface and a lower surface and a second plurality of apertures along the periphery thereof, each of said second plurality of apertures corresponding to each of said first plurality of apertures, said lower surface having at least one compression plate recess formed therein, and at least one compression plate aperture formed therein;
   c) at least one compression spring disposed between said backer plate and said compression plate, said at least one compression spring being retained by said at least one backer plate recess and said at least one compression plate recess; and
   d) a screw tension release mechanism screwed into said backer plate threaded aperture and inserted into said compression plate aperture.

2. The spring actuated clamping mechanism in accordance with claim 1, wherein said lower surface of said backer plate is configured in one of the group: planar and convex.

3. The spring actuated clamping mechanism in accordance with claim 1, wherein said at least one backer plate recess and said at least one compression plate recess comprises four recesses, respectively.

4. The spring actuated clamping mechanism in accordance with claim 3, wherein said at least one compression spring comprises four compression springs, each corresponding to one of said four compression plate recesses.

5. The spring actuated clamping mechanism in accordance with claim 4, wherein said at least one compression spring comprises four compression springs, each corresponding to one of said four backer plate recesses.

6. The spring actuated clamping mechanism in accordance with claim 1, wherein said threaded backer plate aperture corresponds to and is aligned with said compression plate aperture.

7. The spring actuated clamping mechanism in accordance with claim 6, further comprising a nut disposed proximate said upper surface of said compression plate and said compression aperture for retaining said screw tension release mechanism therein.

\* \* \* \* \*